US 008489376B2

(12) United States Patent
Schaub et al.

(10) Patent No.: US 8,489,376 B2
(45) Date of Patent: Jul. 16, 2013

(54) CONTROLLER AND FABRIC PERFORMANCE TESTING

(75) Inventors: Marc A. Schaub, Sunnyvale, CA (US); Shun Wai Go, Cupertino, CA (US); Sukalpa Biswas, Fremont, CA (US); Timothy J. Millet, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 470 days.

(21) Appl. No.: 12/860,668

(22) Filed: Aug. 20, 2010

(65) Prior Publication Data
US 2012/0046930 A1 Feb. 23, 2012

(51) Int. Cl.
*G06F 17/50* (2006.01)
*G06F 13/00* (2006.01)

(52) U.S. Cl.
USPC .............. 703/13; 703/22; 702/182; 716/102; 716/106

(58) Field of Classification Search
USPC ........ 703/13, 22; 716/1, 5, 102, 106; 702/182
See application file for complete search history.

(56) References Cited

U.S. PATENT DOCUMENTS

| | | | |
|---|---|---|---|
| 6,026,230 A | | 2/2000 | Lin et al. |
| 7,096,393 B2 | | 8/2006 | Caty et al. |
| 7,570,651 B2 | | 8/2009 | Haghighi |
| 7,577,540 B2 | | 8/2009 | Wang et al. |
| 8,032,329 B2 * | | 10/2011 | Chou et al. ................... 702/182 |
| 2002/0073380 A1 * | | 6/2002 | Cooke et al. .................. 716/1 |
| 2007/0112549 A1 | | 5/2007 | Lau et al. |
| 2009/0222777 A1 * | | 9/2009 | Shen et al. ................... 716/5 |
| 2010/0057400 A1 * | | 3/2010 | Chou et al. ................... 702/182 |
| 2011/0213949 A1 * | | 9/2011 | Jayasimha et al. .......... 712/29 |

OTHER PUBLICATIONS

Synopsys, "Platform Architect," 2010 Synopsis, 3 pages.
Sonics, "SonicsStudio Development Environment," printed from the Internet on Aug. 2, 2010, 2 pages.
Janick Bergeron, et al., "Verification Methodology Manual for System Verilog," Springer, 2005, 52 page sheets.
ARM the Architecture for the Digital World, "ARM Unveils New AMBA System IP for Low Power and Media Rich SoC Designs," Oct. 21, 2009, 7 pages.

* cited by examiner

*Primary Examiner* — Thai Phan
(74) *Attorney, Agent, or Firm* — Lawrence J. Merkel; Meyertons, Hood, Kivlin, Kowert & Goetzel, P.C.

(57) ABSTRACT

In an embodiment, a model may be created using a register-transfer level (RTL) representation (or other cycle-accurate representation) of the controller and the circuitry in the communication fabric to the controller. The request sources may be replaced by transactors, which may generate transactions to test the performance of the fabric and controller. Accordingly, only the designs of the controller and the fabric circuitry may be needed to model performance in this embodiment. In an embodiment, at least some of the transactors may be behavioral transactors that attempt to mimic the operation of corresponding request sources. Other transactors may be statistical distributions, in some embodiments. In an embodiment, the transactors may include a transaction generator (e.g. behavioral or statistical) and a protocol translator configured to convert generated transactions to the communication protocol in use at the point that the transactor is connected to the fabric.

23 Claims, 7 Drawing Sheets

CONTROLLER AND FABRIC PERFORMANCE TESTING

BACKGROUND

1. Field of the Invention

This invention is related to integrated circuit design and, more particularly, to testing the performance of controllers and communication fabrics in integrated circuits.

2. Description of the Related Art

Complex electronic systems include controllers (e.g. memory controllers, interface controllers, etc.) and numerous request sources that generate requests handled by the controllers. A communication fabric of some sort (e.g. busses, point to point connections, etc.) connects the request sources to the controller. Different request sources have different performance requirements and request patterns, and in a complex system it is not clear whether the performance requirements can be met by a given communication fabric or controller design.

Early in the design cycle of a system, designers will often model the system using high level programming languages such as C, C++, etc. These models execute fairly rapidly, and thus various use cases for the system can be explored. On the other hand, these models approximate the operation of the components of the system, and are not very accurate. Accordingly, some insight into the performance of the system can be gained, but it is difficult to pinpoint performance problems and design solutions to the performance problems.

Later in the design cycle, once the components of the system have actually been designed, simulation models can be generated from the cycle-accurate design descriptions (e.g. the hardware description language (HDL) descriptions). While these simulations are accurate, they are much slower and the ability to perform large-scale simulations for performance evaluation is limited. In some cases, an FPGA implementation of the design can be created for software development purposes, and the FPGA implementation is faster than the simulation. In either case, the accurate designs become available late in the design cycle, when it is more difficult and risky to perform design changes to address performance problems.

SUMMARY

In an embodiment, a model may be created using a register-transfer level (RTL) representation of the controller and the circuitry in the communication fabric to the controller. The request sources may be replaced by transactors in the model, which may generate transactions to test the performance of the fabric and controller. Accordingly, only the controller and the fabric circuitry may be modeled using a cycle-accurate model to measure performance in this embodiment. In an embodiment, at least some of the transactors may be behavioral transactors that attempt to mimic the operation of corresponding request sources. Other transactors may be statistical distributions, in some embodiments. In an embodiment, the transactors may include a transaction generator (e.g. behavioral or statistical) and a protocol translator configured to convert generated transactions to the communication protocol in use at the point that the transactor is connected to the fabric. In some embodiments, other cycle-accurate representations of the controller and fabric circuitry may be used.

The modeling methodology described herein may provide highly accurate (e.g. cycle accurate) performance simulation results for the controller and fabric early in the design cycle, when changes to the design may be more readily made to address performance problems. Such accurate models may be particularly helpful for complex fabrics and controllers, which may implement reordering of operations and other features which result in complex delay patterns in at least some instances. The modeling methodology may also use modular transactors (transaction generators and protocol translators), which may ease the process of using different transactors at different points in the communication fabric. Simulations performed using a performance model described herein may execute relatively rapidly, permitting a variety of use cases for the system to be simulated to evaluate the controller and the fabric (either separately or together). Performance of the controller and fabric under real-world stresses may be estimated with high accuracy, in some embodiments.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/ circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/ component.

DETAILED DESCRIPTION OF EMBODIMENTS

Figure 1:
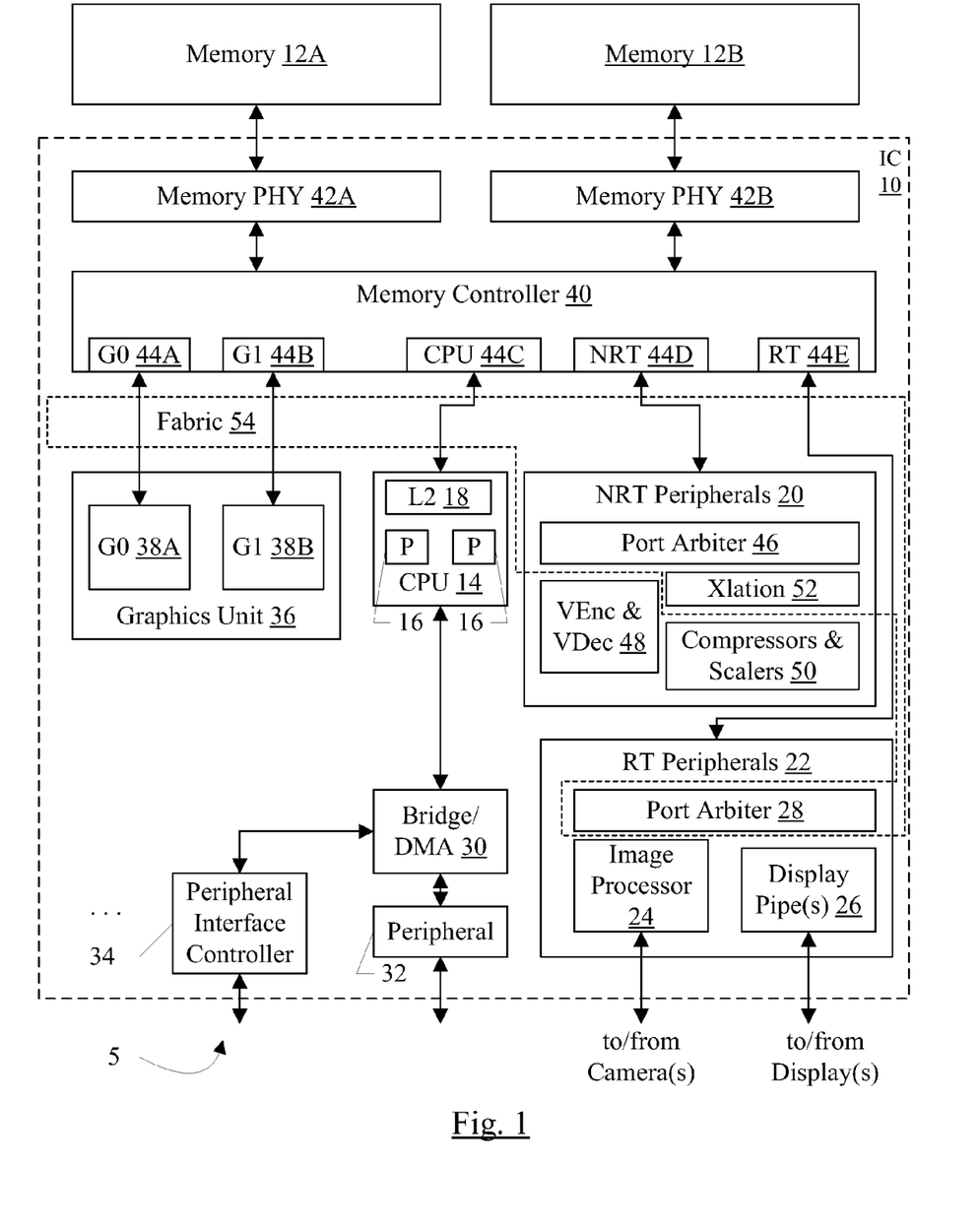
FIG. 1 is a block diagram of one embodiment of a system including a memory controller and a memory communication fabric.

In order to provide context for the performance modeling described below, an example system is illustrated in FIG. 1 and described below. However, the performance modelling may be performed on any controller (e.g. a memory controller or an peripheral interface controller) and any communication fabric between the controller and the other components of the system that may issue requests to the controller. Generally, a system may include a controller, a device or devices controlled by that controller (e.g. slaves to the controller), and one or more request sources that may issue requests to the controller to by serviced by the devices controlled by that controller (e.g. memory operations to a memory controller, I/O operations to a peripheral interface controller, etc.).
System Overview Turning now to FIG. 1, a block diagram of one embodiment of a system 5 is shown. In the embodiment of FIG. 1, the system 5 includes an integrated circuit (IC) 10 coupled to external memories 12A-12B. In the illustrated embodiment, the integrated circuit 10 includes a central processor unit (CPU) block 14 which includes one or more processors 16 and a level 2 (L2) cache 18. Other embodiments may not include L2 cache 18 and/or may include additional levels of cache. Additionally, embodiments that include more than two processors 16 and that include only one processor 16 are contemplated. The integrated circuit 10 further includes a set of one or more non-real time (NRT) peripherals 20 and a set of one or more real time (RT) peripherals 22. In the illustrated embodiment, the NRT peripherals 20 include a port arbiter 46, a video encoder and a video decoder 48, translation unit 52, and compressors and scalers 50. In an embodiment, there may be two compressors and two scalers in the compressors and scalers 50. Other embodiments may include any number of video encoders, video decoders, compressors, and scalars or any combination thereof and/or any other peripherals. In the illustrated embodiment, the RT peripherals include an image processor 24, one or more display pipes 26, and a port arbiter 28. Other embodiments may include more or fewer image processors 24, more or fewer display pipes 26, and/or any additional real time peripherals as desired. The image processor 24 may be coupled to receive image data from one or more cameras in the system 5. Similarly, the display pipes 26 may be coupled to one or more display controllers (not shown) which control one or more displays in the system. In the illustrated embodiment, the CPU block 14 is coupled to a bridge/direct memory access (DMA) controller 30, which may be coupled to one or more peripheral devices 32 and/or one or more peripheral interface controllers 34. The number of peripheral devices 32 and peripheral interface controllers 34 may vary from zero to any desired number in various embodiments. The system 5 illustrated in FIG. 1 further includes a graphics unit 36 comprising one or more graphics controllers such as G0 38A and G1 38B. The number of graphics controllers per graphics unit and the number of graphics units may vary in other embodiments. As illustrated in FIG. 1, the system 5 includes a memory controller 40 coupled to one or more memory physical interface circuits (PHYs) 42A-42B. The memory PHYs 42A-42B are configured to communicate on pins of the integrated circuit 10 to the memories 12A-12B. The memory controller 40 also includes a set of ports 44A-44E. The ports 44A-44B are coupled to the graphics controllers 38A-38B, respectively. The CPU block 14 is coupled to the port 44C. The NRT peripherals 20 and the RT peripherals 22 are coupled to the ports 44D-44E, respectively. The number of ports included in a memory controller 40 may be varied in other embodiments, as may the number of memory controllers. That is, there may be more or fewer ports than those shown in FIG. 1. The number of memory PHYs 42A-42B and corresponding memories 12A-12B may be one or more than two in other embodiments. Together, the interconnect between the memory controller 40 and the graphics unit 36, the CPU block 14, the NRT peripherals 20 and the RT peripherals 22 may comprise a memory fabric 54, illustrated via a dashed box in FIG. 1. The memory fabric 54 may further include various circuitry that communicates on the fabric 54, such as the arbiters 28 and 46, the translation unit 52, etc.

In one embodiment, each port 44A-44E may be associated with a particular type of traffic. For example, in one embodiment, the traffic types may include RT traffic, NRT traffic, and graphics traffic. Other embodiments may include other traffic types in addition to, instead of, or in addition to a subset of the above traffic types. Each type of traffic may be characterized differently (e.g. in terms of requirements and behavior), and the memory controller may handle the traffic types differently to provide higher performance based on the characteristics. For example, RT traffic requires servicing of each memory operation within a specific amount of time. If the latency of the operation exceeds the specific amount of time, erroneous operation may occur in the RT peripheral. For example, image data may be lost in the image processor 24 or the displayed image on the displays to which the display pipes 26 are coupled may visually distort. RT traffic may be characterized as isochronous, for example. On the other hand, graphics traffic may be relatively high bandwidth, but is not latency-sensitive. NRT traffic, such as from the processors 16, is more latency-sensitive for performance reasons but survives higher latency. That is, NRT traffic may generally be serviced at any latency without causing erroneous operation in the devices generating the NRT traffic. Similarly, the less latency-sensitive but higher bandwidth graphics traffic may be generally serviced at any latency. Other NRT traffic may include audio traffic, which is relatively low bandwidth and generally may be serviced with reasonable latency. Most peripheral traffic may also be NRT (e.g. traffic to storage devices such as magnetic, optical, or solid state storage).

Generally, a port may be a communication point on the memory controller 40 to communicate with one or more sources. In some cases, the port may be dedicated to a source (e.g. the ports 44A-44B may be dedicated to the graphics controllers 38A-38B, respectively). In other cases, the port may be shared among multiple sources (e.g. the processors 16 may share the CPU port 44C, the NRT peripherals 20 may share the NRT port 44D, and the RT peripherals 22 may share the RT port 44E. A port may be coupled to a single interface to communicate with the one or more sources. Thus, when sources share an interface, there may be an arbiter on the sources' side of the interface to select between the sources. For example, the L2 cache 18 may serve as an arbiter for the CPU port 44C to the memory controller 40. The port arbiters 28 and 46 may serve as arbiters for the RT port 44E and the NRT port 44D, respectively. The single source on a port or the combination of sources on a port may be referred to as an agent. The arbiter (e.g. port arbiter or L2 cache arbiter) may be part of the communication fabric 54, in this embodiment.

Each port 44A-44E is coupled to an interface to communicate with its respective agent. The interface may be any type of communication medium (e.g. a bus, a point-to-point interconnect, etc.) and may implement any protocol. In some embodiments, the ports 44A-44E may all implement the same interface and protocol. In other embodiments, different ports may implement different interfaces and/or protocols. For example, the embodiment illustrated in FIG. 1 includes the graphics controllers 38A-38B using one type of interface/protocol and the CPU block 14, the NRT peripherals 20 and the RT peripherals 22 using another type of interface/protocol. An interface may refer to the signal definitions and electrical properties of the interface, and the protocol may be the logical definition of communications on the interface (e.g. including commands, ordering rules, coherence support if any, etc.). Some embodiments of the integrated circuit 10 may include circuitry purchased from a third party as a prepackaged unit typically referred to in the industry as intellectual property (IP). The IP may be "hard" (in which case it is specified as a netlist of circuits that are laid out and placed on the IC as a block) or "soft" (in which case it is specified as a synthesizable block that can be synthesized with other blocks to be included in the integrated circuit 10). Both soft and hard IP include a specified interface and protocol, which generally cannot be changed by the designer of the integrated circuit 10 (at least without payment of fees to the third party that owns the IP).

Together, the interfaces to the memory controller 40 may be viewed as the memory fabric 54 to communicate with the memory controller 40. Control circuitry that operates on the fabric or routes memory operations (requests) on the interfaces may be part of the memory fabric 54 as well. Generally, a memory fabric may be any combination of request routing circuitry and interconnect between one or more memory request sources and the memory controller 40. More generally, a communication fabric may be any combination of request routing circuitry and interconnect between one or more request sources and a given controller that receives the requests and transmits them to devices/slaves controlled by the controller. For example, the control circuitry may include arbiters such as arbiters 28 and 46, bridges such as bridge 30, routing circuits, translation circuitry to translate addresses or requests such as translation unit 42, queuing and/or buffering circuitry, direct memory access (DMA) circuitry, circuitry (often referred to as a "widget") to augment third-party IP in the system to perform specific additional communication for which the third-party IP is not designed, etc. The interconnect may include ports coupled to agents, and may also include any other desired interconnect such as meshes, network on a chip fabrics, buses, point-to-point interconnects, etc.

In an embodiment, each source may assign a quality of service (QoS) parameter to each memory operation transmitted by that source. The QoS parameter may identify a requested level of service for the memory operation. Memory operations with QoS parameter values requesting higher levels of service may be given preference over memory operations requesting lower levels of service. Thus, a given source may be configured to use QoS parameters to identify which memory operations are more important to the source (and thus should be serviced prior to other memory operations from the same source), especially for sources that support out-of-order data transmissions with respect to the address transmissions from the source. Furthermore, the QoS parameters may permit sources to request higher levels of service than other sources on the same port and/or sources on other ports.

The memory controller 40 may be configured to process the QoS parameters received on each port 44A-44E and may use the relative QoS parameter values to schedule memory operations received on the ports with respect to other memory operations from that port and with respect to other memory operations received on other ports. Accordingly, the performance of the memory fabric may be affected by the QoS parameters that are assigned by the request sources to their requests.

The processors 16 may implement any instruction set architecture, and may be configured to execute instructions defined in that instruction set architecture. The processors 16 may employ any microarchitecture, including scalar, superscalar, pipelined, superpipelined, out of order, in order, speculative, non-speculative, etc., or combinations thereof. The processors 16 may include circuitry, and optionally may implement microcoding techniques. The processors 16 may include one or more level 1 caches, and thus the cache 18 is an L2 cache. Other embodiments may include multiple levels of caches in the processors 16, and the cache 18 may be the next level down in the hierarchy. The cache 18 may employ any size and any configuration (set associative, direct mapped, etc.).

The graphics controllers 38A-38B may be any graphics processing circuitry. Generally, the graphics controllers 38A-38B may be configured to render objects to be displayed into a frame buffer. The graphics controllers 38A-38B may include graphics processors that may execute graphics software to perform a part or all of the graphics operation, and/or hardware acceleration of certain graphics operations. The amount of hardware acceleration and software implementation may vary from embodiment to embodiment.

The NRT peripherals 20 may include any non-real time peripherals that, for performance and/or bandwidth reasons, are provided independent access to the memory 12A-12B. That is, access by the NRT peripherals 20 is independent of the CPU block 14, and may proceed in parallel with CPU block memory operations. Other peripherals such as the peripheral 32 and/or peripherals coupled to a peripheral interface controlled by the peripheral interface controller 34 may also be non-real time peripherals, but may not require independent access to memory. Various embodiments of the NRT peripherals 20 may include video encoders and decoders 48, scaler circuitry and image compression/decompression circuitry 50, etc.

As mentioned above, the RT peripherals 22 may include the image processor 24 and the display pipes 26. The display pipes 26 may include circuitry to fetch one or more frames and to blend the frames to create a display image. The display pipes 26 may further include one or more video pipelines. The result of the display pipes 26 may be a stream of pixels to be displayed on the display screen. The pixel values may be transmitted to a display controller for display on the display screen. The image processor 26 may receive camera data and process the data to an image to be stored in memory.

The bridge/DMA controller 30 may comprise circuitry to bridge the peripheral(s) 32 and the peripheral interface controller(s) 34 to the memory space. In the illustrated embodiment, the bridge/DMA controller 30 may bridge the memory operations from the peripherals/peripheral interface controllers through the CPU block 14 to the memory controller 40. The CPU block 14 may also maintain coherence between the bridged memory operations and memory operations from the processors 16/L2 Cache 18. The L2 cache 18 may also arbitrate the bridged memory operations with memory operations from the processors 16 to be transmitted on the CPU interface to the CPU port 44C. The bridge/DMA controller 30 may also provide DMA operation on behalf of the peripherals 32 and the peripheral interface controllers 34 to transfer blocks of data to and from memory. More particularly, the DMA controller may be configured to perform transfers to and from the memory 12A-12B through the memory controller 40 on behalf of the peripherals 32 and the peripheral interface controllers 34. The DMA controller may be programmable by the processors 16 to perform the DMA operations. For example, the DMA controller may be programmable via descriptors. The descriptors may be data structures stored in the memory 12A-12B that describe DMA transfers (e.g. source and destination addresses, size, etc.). Alternatively, the DMA controller may be programmable via registers in the DMA controller (not shown).

The peripherals 32 may include any desired input/output devices or other hardware devices that are included on the integrated circuit 10. For example, the peripherals 32 may include networking peripherals such as one or more networking media access controllers (MAC) such as an Ethernet MAC or a wireless fidelity (WiFi) controller. An audio unit including various audio processing devices may be included in the peripherals 32. One or more digital signal processors may be included in the peripherals 32. The peripherals 32 may include any other desired functional such as timers, an on-chip secrets memory, an encryption engine, etc., or any combination thereof The peripheral interface controllers 34 may include any controllers for any type of peripheral interface. For example, the peripheral interface controllers may include various interface controllers such as a universal serial bus (USB) controller, a peripheral component interconnect express (PCIe) controller, a flash memory interface, general purpose input/output (I/O) pins, etc.

The memories 12A-12B may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMM5), etc. Alternatively, the devices may be mounted with the integrated circuit 10 in a chip-on-chip configuration, a package-on-package configuration, or a multi-chip module configuration.

The memory PHYs 42A-42B may handle the low-level physical interface to the memory 12A-12B. For example, the memory PHYs 42A-42B may be responsible for the timing of the signals, for proper clocking to synchronous DRAM memory, etc. In one embodiment, the memory PHYs 42A-42B may be configured to lock to a clock supplied within the integrated circuit 10 and may be configured to generate a clock used by the memory 12.

It is noted that other embodiments may include other combinations of components, including subsets or supersets of the components shown in FIG. 1 and/or other components. While one instance of a given component may be shown in FIG. 1, other embodiments may include one or more instances of the given component. Similarly, throughout this detailed description, one or more instances of a given component may be included even if only one is shown, and/or embodiments that include only one instance may be used even if multiple instances are shown.

Performance Model

Figure 2:
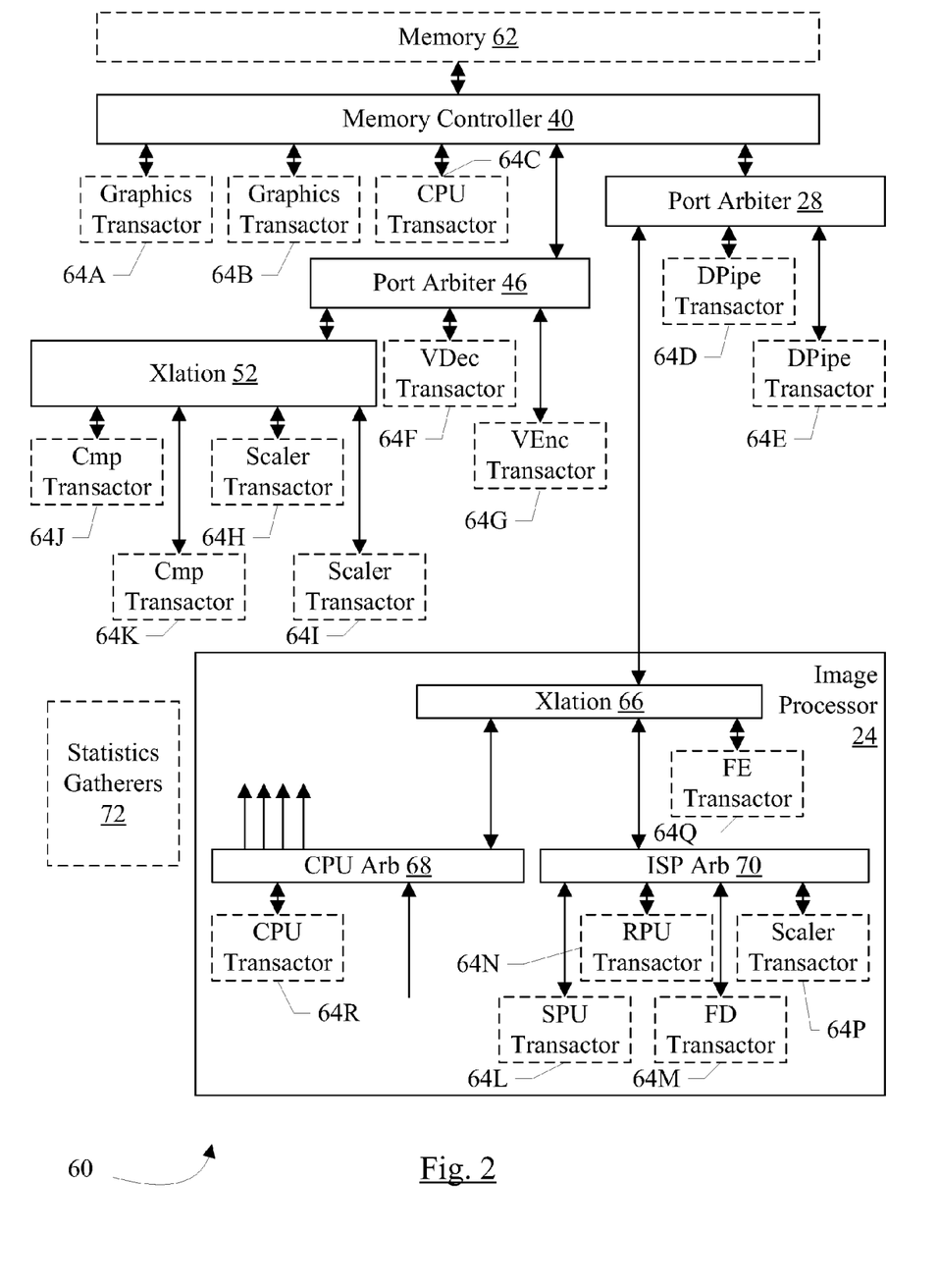
FIG. 2 is a block diagram of one embodiment of a performance model of the system shown in FIG. 1.

Turning now to FIG. 2, a block diagram of one embodiment of a performance model 60 that may be used to model performance of the memory fabric and memory controller 40 from FIG. 1 is shown. In the embodiment of FIG. 2, blocks having solid lines, such as the memory controller 40, may be the components under test. Blocks shown in dotted lines (e.g. the memory 62 and various transactors 64A-64Q) may be models created to test the performance of the components under test. In FIG. 2, the memory controller 40 may be the design of the memory controller 40 from the system 5, and the port arbiter 28, the port arbiter 46, and the translation unit 42 may similarly be the designs for these components. One or more of the components may be third-party IP and others may be custom-designed, in various embodiments. In the illustrated embodiment, the image processor 24 is further represented in the model by a translation unit 66, a central processing unit (CPU) arbiter 68, and an image signal processor (ISP) arbiter 70. The translation unit 66 and the arbiters 68 and 70 may similarly be the designs for these components, and the remainder of the image processor 24 may be modeled as transactors. Thus, the memory fabric in FIG. 2 may include the arbiters 28, 46, 58, and 70; the translation units 52 and 66, and the interconnect between these units.

The components under test may be represented in the performance model by the actual designs (e.g. register-transfer level (RTL) representations of the designs or hardware description language (HDL) representations of the designs). An RTL representation of a component may describe the component in terms of: (i) the registered state of the component (the state that is captured in a clock cycle in clocked storage devices such as flops, registers, latches, memory, etc.); and (ii) the logical operation of the component on a combination of the registered state and inputs to the component to produce the next registered state and outputs of the component. The RTL descriptions are typically expressed in an HDL, such as Verilog or VHDL. Other HDL representations may also be possible. However, in each case, the components under test may be cycle-accurate to the actual hardware that will be included in the system. Thus, the components under test may be represented by the complete design. Other embodiments may use any other cycle-accurate description/model of the components under test. For example, models coded in a high level programming language such as C may use a direct program interface (DPI) to Verilog designs to model behavior accurately while not actually being represented in RTL.

On the other hand, the transactors 64A-64R may be behavioral models that mimic the operation of the corresponding components on the fabric, but may not be complete designs of the corresponding components. That is, the transactor may be designed to issue requests in a manner similar to the corresponding component, but do not actually implement the corresponding component's internal operation. The transactors 64A-64R may attempt to be as accurate as possible on the fabric while remaining reasonably simple, but may not be cycle-accurate to the corresponding components. In some embodiments, one or more transactors may be statistical distribution models which generate random requests based on a statistical distribution expected to represent the operation of the corresponding component over time. That is, the requests issued by the statistical distribution model may not match the requests actually issued by the corresponding component, but the aggregate of the requests over time may simulate the load of the corresponding component on the memory controller 40 and the memory fabric. The transactors 64A-64R may be coded in the same HDL as the memory controller 40 and fabric component circuits to be simulated using the same simulator.

Any level of abstraction may be supported in the performance model in various embodiments. For example, the graphics transactors 64A-64B may replace the graphics controllers 38A-38B in the performance model, respectively. Thus, the structure of the graphics unit 36 may be fairly accurately modeled. On the other hand, the CPU transactor 64C may abstract away not only the processors 16 and the L2 cache 18, but also the bridge/DMA controller 30 and the peripherals/peripheral interface controllers 32 and 34. The fabric for the NRT peripherals 20 (the port arbiter 46 and the translation unit 52) may be included, and transactors corresponding to the compressor/decompressors 64J-64K, the scalers 64H-64I, the video decoder 64F, and the video encoder 64G may be provided to generate requests.

In the illustrated embodiment, the fabric for the RT peripherals 22 includes the port arbiter 28 as well as internal fabric within the image processor 24. However, other embodiments may abstract the image processor 24 as a transactor. The display pipe transactors 64D-64E may be included to mimic operation of the display pipes 26, and the FE transactor 64Q, the RPU transactor 64N, the scalar transactor 64P, the SPU transactor 64L, the FD transactor 64M, and the CPU transactor 64R may represent operation of the internal components of the image processor 24. Particularly, the FE transactor 64Q may model front end processing such as writing raw camera sensor data to memory; the RPU transactor 64N may model red-green-blue (RGB) processing of camera sensor data; the SPU transactor 64L may model statistics processing for the statistics from the camera sensor; and the FD transactor 64M may model face detection hardware in the image processor 24. As illustrated within the image processor 24, some inputs and outputs may remain unconnected in the performance model if not needed for the performance simulation (e.g. one of the inputs to the CPU arbiter 68 and several outputs of the CPU arbiter 68 are not connected in FIG. 2).

In addition to the memory controller 40, the memory fabric, and the transactors 64A-64R, the performance model 60 may include one or more statistics gathers 72. The statistics gatherers 72 may monitor events in the performance simulations, and may gather statistics that may be viewed after the simulation completes as part of the simulation results. Since the performance model 60 is an HDL-based model, various signals throughout the model may also be viewed using industry standard simulation tools. Accordingly, if the statistics or some other simulation results cause the viewer to wish to see operation of a particular part of the model, such visibility may be provided via the standard simulation tools.

Figure 3:
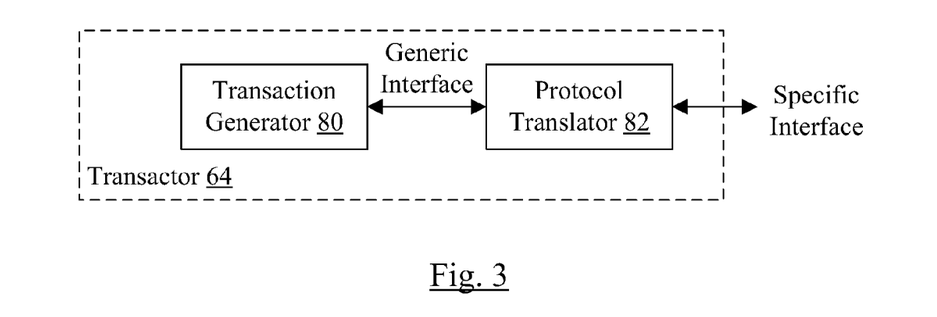
FIG. 3 is a block diagram of one embodiment of a transactor.

Turning to FIG. 3, a block diagram of one embodiment of a transactor 64 is shown. Any of the transactors 64A-64R may be implemented using the transactor 64. The transactor 64 may include a transaction generator 80 configured to generate transaction requests and a protocol translator 82 configured to translate the protocol from a generic interface between the transaction generator 80 and the protocol translator 82 to a specific interface at the point at which the transactor 82 connects in the performance model 60.

The transactor 64 as illustrated in FIG. 3 is a modular design which separates the operation of the transaction generator 80 from the protocol translation. Accordingly, transaction generators 80 may be created and may be connected to an appropriate protocol converter to be used anywhere in a fabric. Thus, for example, the transaction generator 80 may be used with a first protocol translator 82 to connect in place of the graphics controller 38A as the transactor 64A. The first protocol translator 82 may thus implement the protocol of the graphics controller interface. The same transaction generator 80 may be used with a second protocol translator 82 to form the display pipe transactor 64E, and may connect the second protocol translator 82 may implement the protocol of the port arbiter 28.

Figure 4:
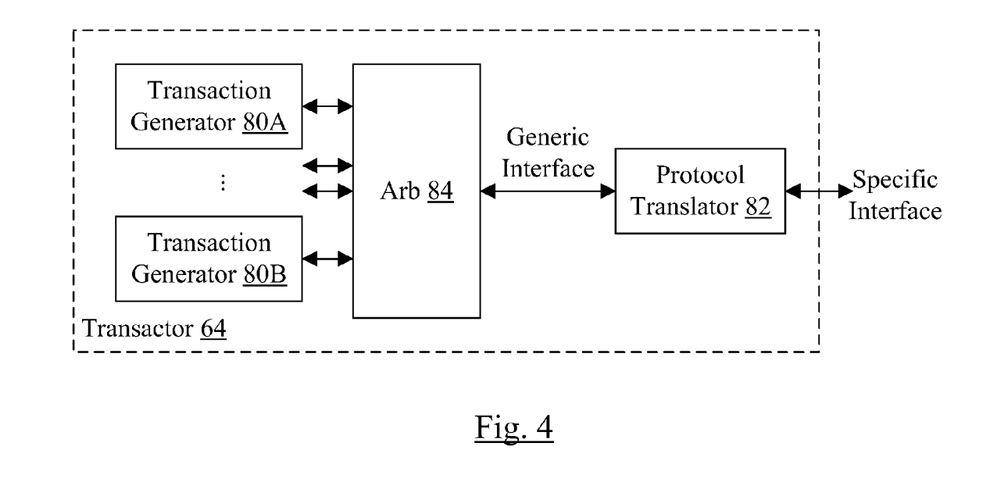
FIG. 4 is a block diagram of another embodiment of a transactor.

The embodiment of the transactor 64 shown in FIG. 3 includes one transaction generator 80. However, more complex patterns of requests may be generated, if desired, by including multiple transaction generators and an arbiter to select between the transaction generators. For example, FIG. 4 is a block diagram of an embodiment of the transactor 64 that includes multiple transaction generators such as generators 80A-80B (and may include additional generators if desired) coupled to an arbiter 84. The interface between the arbiter 84 and the protocol translator 82 may be the generic interface discussed above, and the interface between the transaction generators 80A-80B and the arbiter 84 may also be the generic interface. Thus, the arbiter 84 may be a multiplexor (mux) and the selection control to the mux may implement the arbitration. The arbiter 84 may implement any arbitration algorithm (e.g. round robin, weighted round robin, priority, etc.).

Figure 5:
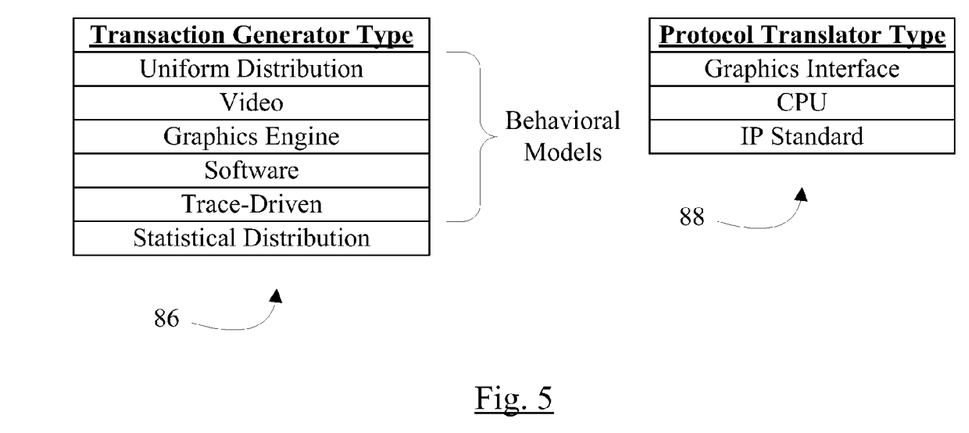
FIG. 5 is a table illustrating exemplary transaction generator types and a table illustrated example protocol translator types.

As mentioned above, a variety of transaction generators 80 may be supported. FIG. 5 includes a table 86 illustrating one embodiment of various types of transaction generators that may be supported in transaction generators 80. Specifically, various behavioral models may be supported, as well as a statistical distribution model as mentioned previously.

The behavioral models in table 86 include a uniform distribution model, a video model, a graphics engine model, a software model, and a trace-driven model. The uniform distribution model may provide a uniform consumption of a specified amount of bandwidth. In one embodiment, the uniform distribution model may be programmed with a burst size (the size of a request, e.g. measured in bytes) and a maximum number of requests that can be outstanding concurrently. The uniform consumption model may issue requests until the maximum number of outstanding requests is reached and/or the specified bandwidth is reached within a given window of time. If the maximum number is reached, the uniform distribution model may wait for a request to complete prior to issuing another request. The addresses in the uniform distribution model may increase monotonically from request to request.

The video model may support two frames: an active frame and a virtual frame. The virtual frame may define a pixel clock, and the difference between the virtual and active frame may be the horizontal and vertical blanking intervals. Pixels may scanned at the pixel clock rate and when they are in the active frame, pixels may actually popped. No pixels may be popped in the blanking intervals. This video model may model any device with a pixel clock and blanking intervals (e.g. displays & image sensors in this embodiment). The virtual frame size (in the horizontal direction) may thus be the combination of the active frame size in the horizontal direction and the horizontal blanking interval. Similarly, the virtual frame size in the vertical direction may be the combination of the active frame size in the vertical direction and the vertical blanking interval. The and the pixel clock rate may be the product of the virtual frame size in the horizontal direction, the virtual frame size in the vertical direction, and the number of frames per second.

The graphics engine model may be used for the graphics transactors 64A-64B, and may model the operation of the graphics controllers 38A-38B. In one embodiment, this model may be trace-driven. That is, a trace may be generated of the transactions actually generated under real workloads by the graphics controllers 38A-38B, and the trace may be used to generate requests in the transactors. Additionally, the graphics engine model may include caching effects (e.g. a certain number of misses that may be outstanding from the cache, ratios or reads and writes, etc.). Generally, an arbitrary amount of accuracy may be included in trace-driven models. For example, an embodiment of the graphics engine model may include an adaptive read/write ratio limiter. The limiter may readjust for each graphics tile. There may also be modelling for the internal translation lookaside buffer (TLB) operations.

The software model may be an extension of the uniform distribution model, and may attempt to model software executing on a CPU. The software model may be partially trace-driven, and may include uniform distribution operation as well. For example, the software model may use a transactor 64 similar to the embodiment of FIG. 4, with generator 80A implementing a uniform distribution and generator 80B being trace driven.

Other trace-driven models may be supported as well. The trace-driven models may replay traces in various fashions. For example, a trace-driven model may replay a trace using the same transactions and timing in the trace. Alternatively, the trace may be replayed using various modeling techniques such as transaction limiters, which may change the timing of transactions in the model as compared to the original trace. Traces may be generated under particularly stressful workloads unique to a given component, for example. The traces may be derived, e.g., from earlier systems that include the components.

In one embodiment, the graphics transactors 64A-64B may use the graphics engine model; the CPU transactor 64C may use the software model; the display pipe transactors 64D-64E may use the video model; the VDec and VEnc transactors 64F-64G may use the trace-driven model; the scaler transactors 64H-64I and the compressor transactors 64J-64K may use the uniform distribution model; the FE transactor 64Q may use the video model; the scalar transactor 64P, the FD transactor 64M, the SPU transactor 64L, and the RPU transactor 64N may use the uniform distribution model (programmed to simulate a frame burst); and the CPU transactor 64R may use the uniform distribution model.

FIG. 5 also illustrates various protocol translator types that may be supported in an embodiment in a table 88. The protocol translator may support, e.g., a graphics interface that may be used by the graphics controllers 38A-38B (which may be third-party IP in an embodiment), a CPU interface that may be supported by the processors 16 (which may be a third-party IP in an embodiment). The port arbiters 28 and 46, in an embodiment, may also use the CPU interface. Other IP standard interfaces may also be supported.

Figure 6:
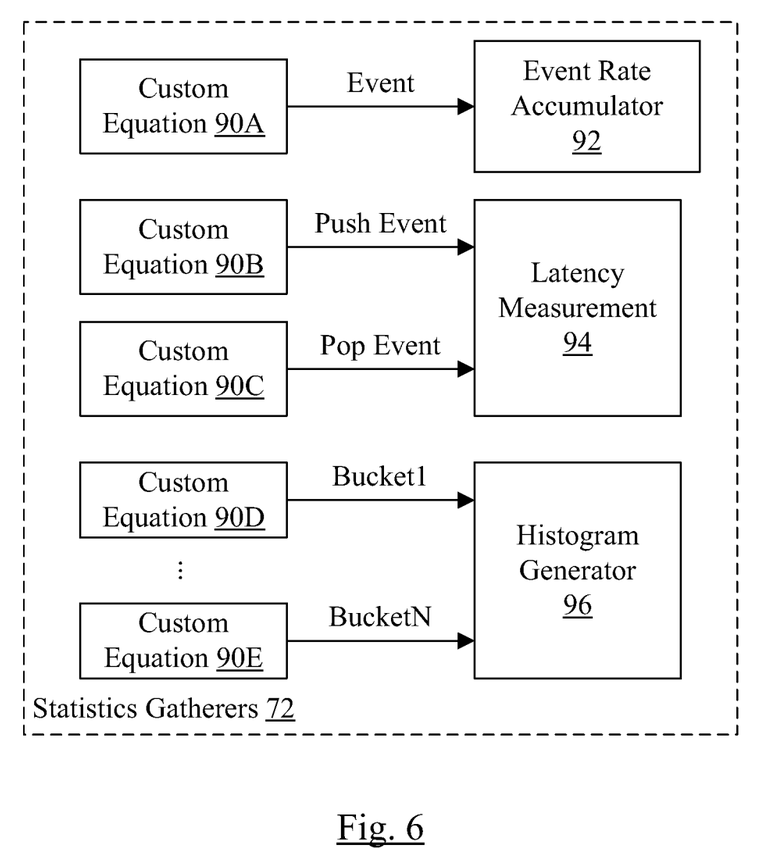
FIG. 6 is a block diagram of one embodiment of one or more statistics gatherers.

Turning next to FIG. 6, a block diagram is shown illustrating one embodiment of the statistics gatherers 72. In the illustrated embodiment, custom equation blocks 90A-90E, an event rate accumulator block 92, a latency measurement block 94, and a histogram generator 96 are shown. Multiple instances of the blocks 92, 94, and/or 96 may be used with different custom equations 90A-90E.

The custom equations 90A-90E may each be HDL equations, which combine various signals in the model 60 to generate an output signal. The equations may use any signals in the model, and may thus detect an occurrence of any arbitrary event in the model 60. Accordingly, the statistics gatherers 72 may be configured to generate any desired statistics.

The event rate accumulator block 92 may be configured to accumulate a rate and/or total number of assertions of the event input signal to the event rate accumulator block 92. Accordingly, a desired event to be measured may be defined, and a custom equation 90A may be written to detect the event and assert the event signal.

The latency measurement unit 94 may be configured to measure latency from the push of an item into the latency measurement unit 94 and a pop of the item from the latency measurement unit 94. The latency measurement unit 94 may track the length of time (e.g. in clock cycles) that each item remains in the latency measurement unit 94 to report the latency. Thus, custom equations 90B and 90C may generate the push event and pop event signals to the latency measurement unit 94. In some embodiments, the latency measurement unit 94 is a first in, first out (FIFO) buffer and the pop events are associated with push events in order. Alternatively, a tag or other identifier may be supplied with the push event and the pop event to match push events to pop events in an out of order fashion.

The histogram generator block 96 may be configured to generate a histogram of various events in buckets (e.g. up to N buckets). In this embodiment, the histogram generator block 96 may receive bucket 1 to bucket N signals, and may increment the count of the corresponding bucket in response to the assertion of the corresponding bucket signal. The custom equations 90D-90E may thus be coded to detect the event associated with each bucket to generate the bucket signals.

Other embodiments may include other types of generic statistics gathering blocks in addition to the block 92, 94, and 96, and a custom equations block may be provided for each instantiation of the other types to gather desired statistics.

Figure 7:
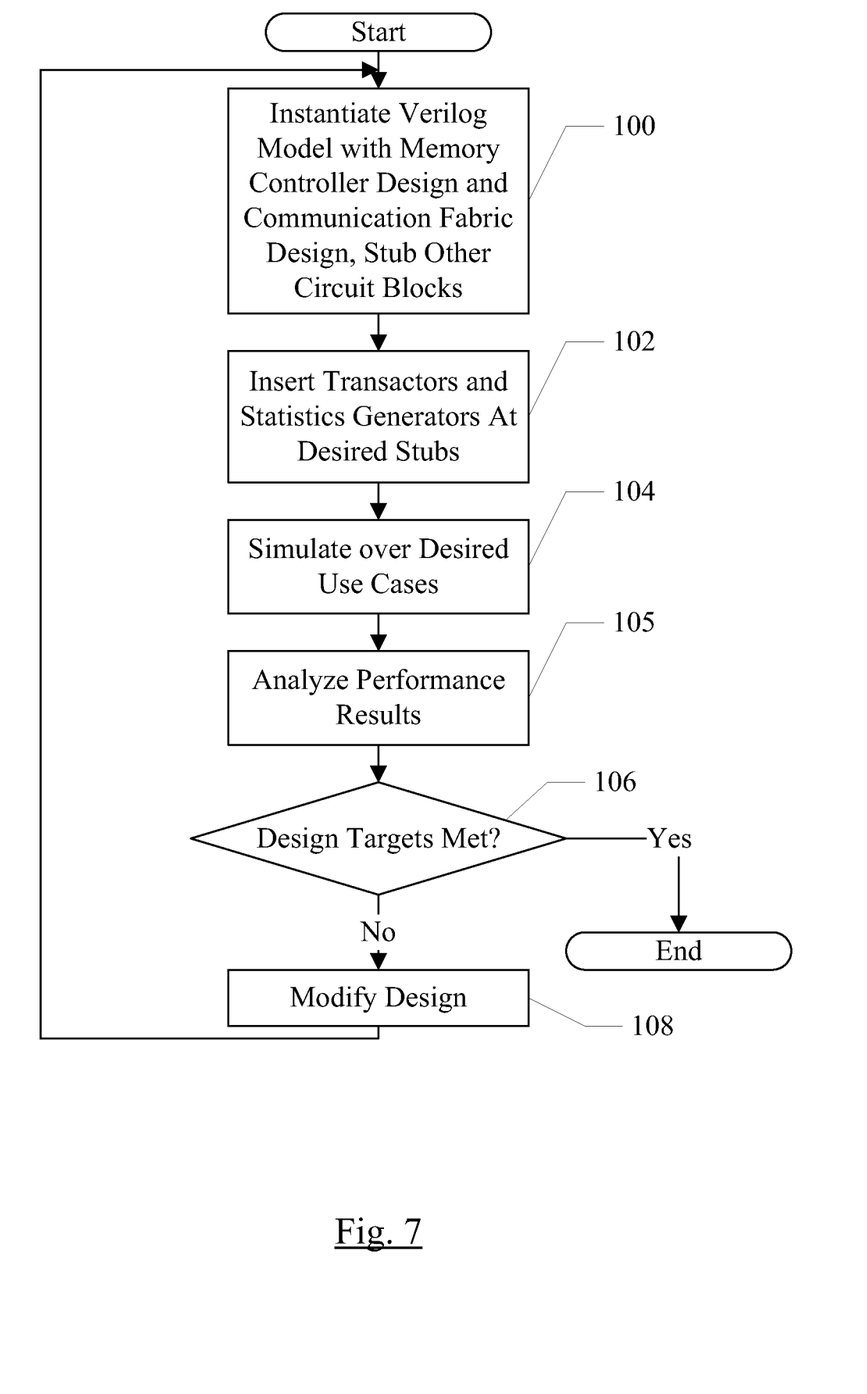
FIG. 7 is a flowchart illustrating a performance testing methodology.

FIG. 7 is a flowchart illustrating a method to verify the performance of the memory controller 40 and associated memory fabric for one embodiment. A similar method may be implemented for other controllers such as interface controllers.

The performance model may be formed using components of the integrated circuit 10. Accordingly, one method for creating the model may be to instantiate the top level model of the integrated circuit 10, including the memory controller 40 design and the design of the memory fabric devices, but stubbing out other circuit blocks (block 100 in FIG. 7). Stubbing out a circuit block may generally refer to removing the circuit block from the model and inserting at "stub" model that instantiates the interface signals to the circuit block (and may include weak pull up/down resistors to provide defined signal values on the interface signals). According, the transactors may be added to the model and may connect to the stubbed signals as desired (block 102). Together, blocks 100 and 102 may be viewed as preparing a performance model for the memory controller 40 and memory fabric. The resulting performance model 60 may then be simulated (block 104) and the performance results may be analyzed and evaluated (block 105). If the design's performance targets are not met (decision block 106, "no" leg), the design may be modified (block 108) and a new performance model 60 using the modified design may be created and simulated (blocks 100, 102, and 104). The flowchart may be iterated until the design meets the performance targets (decision block 106, "yes" leg).

Figure 8:
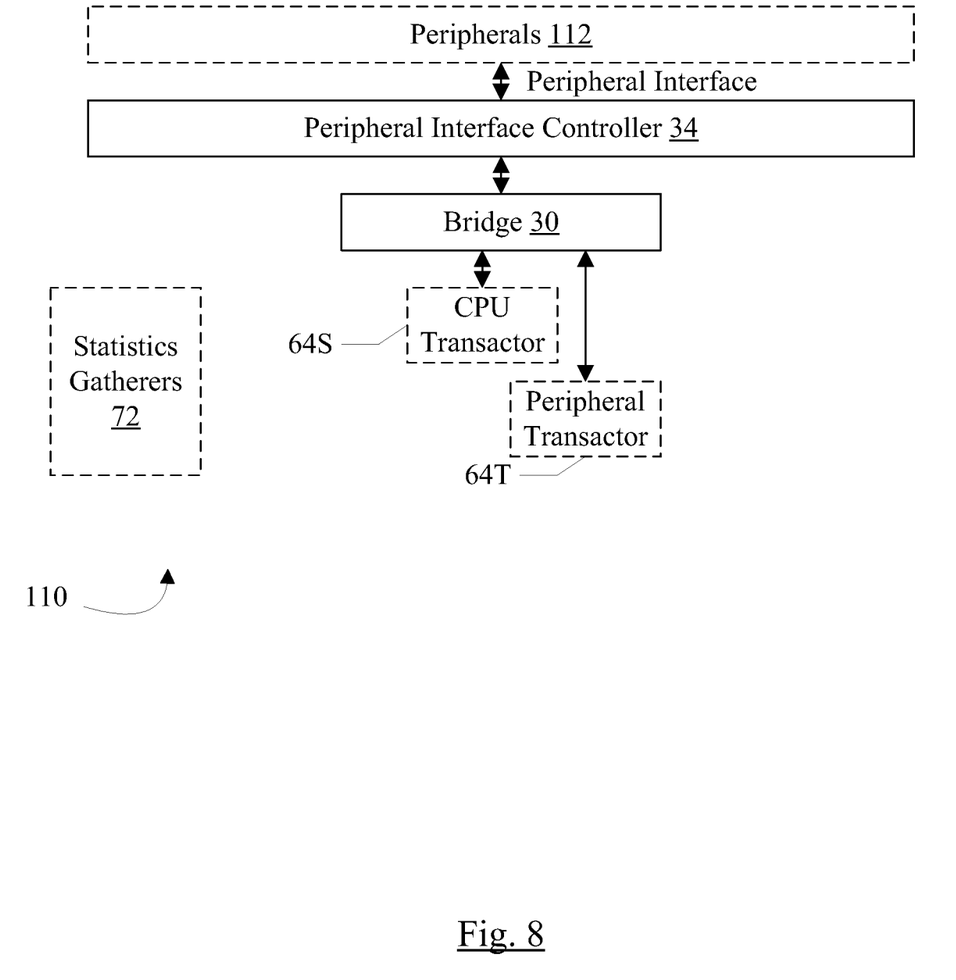
FIG. 8 is a block diagram of another embodiment of a performance model.

As mentioned previously, the performance modeling techniques described with respect to the memory controller 40 and the memory fabric may be used for any controller and corresponding communication fabric. FIG. 8 is a block diagram illustrating a performance model 110 for the peripheral interface controller 34 shown in FIG. 1. The model 110 may include the designs for the peripheral interface controller 34 and the bridge 30, for example, along with a model 112 of one or more peripherals, a CPU transactor 64S corresponding to the CPU block 14 (and other request sources that may issue requests through the CPU block 14) and a peripheral transactor 64T corresponding to the peripheral device 32. Statistics gatherers 72 are also included in the model 110.

Computer Accessible Storage Medium and System

Figure 9:
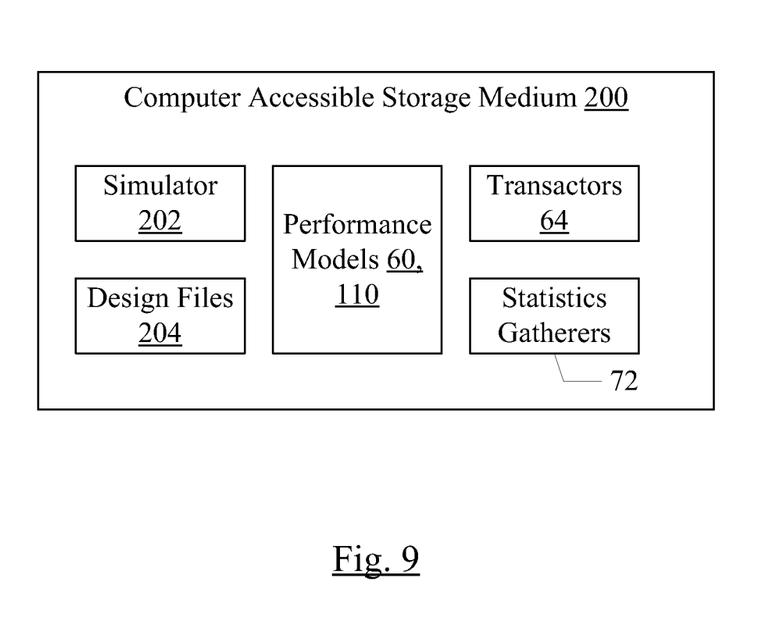
FIG. 9 is a block diagram of one embodiment of a computer accessible storage medium.

Turning now to FIG. 9, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. The computer accessible storage medium 200 in FIG. 9 may store a simulator 202 (that may be configured to simulate the performance models 60 and/or 110), the performance models 60 and/or 110, design files 204 that may include the RTL descriptions of the various components shown in FIG. 1, the transactors 64 (e.g. HDL descriptions), and the statistics gatherers 72. A carrier medium may include computer accessible storage media as well as transmission media such as wired or wireless transmission.

Figure 10:
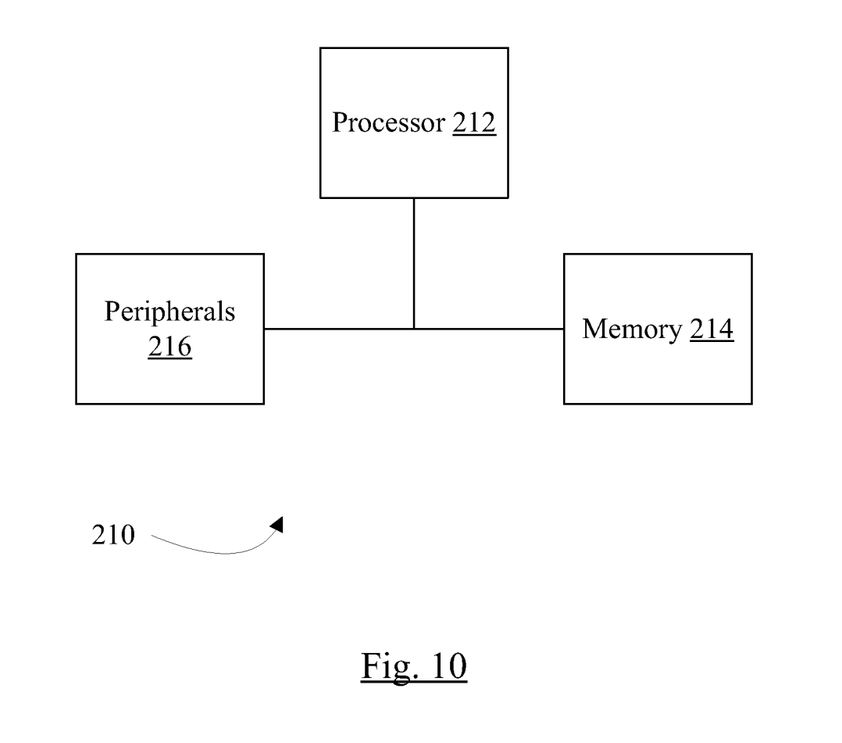
FIG. 10 is a block diagram of one embodiment of a computer system.

FIG. 10 is a block diagram of one embodiment of an exemplary computer system 210. In the embodiment of FIG. 10, the computer system 210 includes a processor 212, a memory 214, and various peripheral devices 216. The processor 212 is coupled to the memory 214 and the peripheral devices 216.

The processor 212 is configured to execute instructions, including the instructions in the software described herein such as the simulator 202. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to coupled the processor 212, the memory 214, and the peripheral devices 216.

The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use, data to be operated upon by the processor 212 during use, etc.

Peripheral devices 216 may represent any sort of hardware devices that may be included in the computer system 210 or coupled thereto (e.g. storage devices, optionally including a computer accessible storage medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method comprising:
preparing a model to test the performance of a memory fabric and a memory controller, wherein the model includes a register-transfer level (RTL) representation of the memory controller and an RTL representation of control circuitry in the memory fabric, and wherein the model further includes one or more transactors configured to generate transactions on the memory fabric, wherein at least one of the one or more transactors is a behavioral model of a corresponding request source at a point on the fabric at which the corresponding request source is coupled during use, wherein preparing the model comprises:
replacing an RTL representation of one or more request sources in the model with one or more stubs; and
connecting the transactors to the stubs; and
simulating the model to determine the performance of the memory fabric and the memory controller over a plurality of use cases.

2. The method as recited in claim 1 wherein at least one other transactor is configured to generate transactions according to a statistical distribution of traffic.

3. The method as recited in claim 1 further comprising:
modifying the design of at least one of memory controller and the control circuitry based on results of the simulating;
preparing a second model including the modified design and the one or more transactors; and
simulating the second model to determine performance of the second model over the plurality of use cases.

4. The method as recited in claim 1 further comprising, during the simulating, the transactors generating transactions that mimic the behavior of one or more request sources on the fabric.

5. The method as recited in claim 1 wherein the behavioral model comprises a uniform distribution model configured to generate transactions of a defined size to consume a defined amount of bandwidth on the memory fabric.

6. The method as recited in claim 1 wherein the behavioral model comprises a video model in which the transactions mimic operations on a virtual frame and an active frame.

7. The method as recited in claim 1 wherein the behavioral model is trace driven.

8. A method comprising:
preparing a model to test the performance of a memory interconnect and a memory controller, wherein the model includes:
a hardware design language (HDL) representation of the memory controller;
an HDL representation of control circuitry in the memory interconnect; and
an HDL representation of one or more transactors configured to generate transactions on the memory interconnect, wherein each of the transactors comprises a transaction generator configured to generate transactions and a protocol translator configured to convert the transactions to a protocol in use on the memory interconnect at a point that the transactor is connected; and wherein preparing the model comprises replacing one or more request sources in the model with one of the one or more transactors.

9. The method as recited in claim 8 wherein the transaction generator is one of a plurality of transaction generators in the transactor, and wherein the transactor further comprises an arbiter coupled to the plurality of transaction generators and configured to arbitrate among the generated transactions to deliver a transaction to the protocol translator.

10. The method as recited in claim 8 further comprising selecting the protocol translator from a plurality of protocol translators based on the protocol in use on the memory interconnect at the point.

11. The method as recited in claim 8 further comprising selecting the transaction generator from a plurality of transaction generators, the selected transaction generator implementing a behavioral model that mimics the request source that the corresponding transactor replaces.

12. The method as recited in claim 8 further comprising the transaction generator generating transactions in a generic format for the protocol translators.

13. A method comprising:
modeling a plurality of request sources in a system with a respective plurality of transactors, wherein the system includes a controller and a communication fabric between the plurality of request sources and the controller, and wherein one or more of the transactors implement behavioral models of the corresponding request sources, and wherein at least one of the behavioral models is trace-driven and is configured to replay a trace of requests actually generated in hardware under a particular workload;
modeling the controller with a cycle-accurate description of the controller; and
modeling control circuitry in the communication fabric with a cycle-accurate description of the control circuitry.

14. The method as recited in claim 13 further comprising:
simulating a model comprising the plurality of transactors, the cycle-accurate description of the controller, and the cycle-accurate description of the communication fabric; and
analyzing a result of the simulating to determine whether or not performance requirements for the controller and the communication fabric are met for the system.

15. The method as recited in claim 13 further comprising:
determining that performance requirements are not met;
modifying a design of the communication fabric in response to the determining; and
modeling the modified design with the cycle-accurate description of the modified design.

16. The method as recited in claim 13 wherein another one of the transactors implements a statistical distribution model.

17. The method as recited in claim 13 wherein the behavioral model comprises a uniform distribution model configured to generate transactions of a defined size to consume a defined amount of bandwidth on the communication fabric.

18. The method as recited in claim 13 wherein the controller is a memory controller and the communication fabric is a memory fabric.

19. The method as recited in claim 18 wherein the behavioral model comprises a video model in which the transactions mimic operations on a virtual frame and an active frame.

20. The method as recited in claim 13 wherein the behavioral model modifies replay of the trace to more accurately model a corresponding request source.

21. A computer accessible storage medium storing a model, which is computer-executable to simulate operation of a system that includes a controller and a communication fabric that connects the controller to a plurality of request sources in the system, wherein the model comprises:
a cycle-accurate representation of the controller;
a cycle-accurate representation of control circuitry in the communication fabric; and
a representation of one or more transactors configured to generate transactions on the communication fabric, wherein each of the transactors comprises a transaction generator configured to generate transactions and a protocol translator configured to convert the transactions to a protocol in use on the communication fabric at a point that the transactor is connected in place of a corresponding one of the plurality of request sources.

22. The computer accessible storage medium as recited in claim 21 wherein the controller is a memory controller.

23. The computer accessible storage medium as recited in claim 21 wherein the controller is a peripheral interface controller.

* * * * *